United States Patent [19]

Senge et al.

[11] Patent Number: 4,859,298

[45] Date of Patent: Aug. 22, 1989

[54] PROCESS AND APPARATUS FOR ELECTROLYTICALLY REMOVING PROTECTIVE LAYERS FROM SHEET METAL SUBSTRATE

[75] Inventors: F. Gerhard Senge; Angus A. Watson, both of State College; Kenneth E. Sanner, Spring Mills; Terry R. Corbin, Huntingdon, all of Pa.

[73] Assignee: Chemcut Corporation, State College, Pa.

[21] Appl. No.: 280,987

[22] Filed: Dec. 7, 1988

[51] Int. Cl.⁴ ............................................. C25F 5/00
[52] U.S. Cl. .................................... 204/146; 204/202
[58] Field of Search ....................... 204/146, 198, 202

[56] References Cited

U.S. PATENT DOCUMENTS

| | | | |
|---|---|---|---|
| 3,351,126 | 9/1964 | Richards et al. | 164/278 |
| 3,368,959 | 2/1968 | Pedone | 202/202 |
| 3,598,171 | 8/1971 | Schultz | 164/109 |
| 3,625,806 | 12/1971 | Wennburg | 156/584 |
| 3,649,490 | 3/1972 | Nolan et al. | 204/146 |
| 3,807,020 | 4/1974 | Van Raeveis et al. | 29/762 |
| 4,196,510 | 4/1980 | Gudmestad et al. | 29/867 |
| 4,209,379 | 6/1980 | Freeman et al. | 204/198 |
| 4,554,062 | 11/1985 | Sergio | 204/206 |

*Primary Examiner*—T. M. Tufariello
*Attorney, Agent, or Firm*—Paul & Paul

[57] ABSTRACT

A process and apparatus is provided to remove protective layers, such as various chromate coatings from metal sheets such as printed circuit boards, copper foils and the like, in a continuous manner while the articles are being conveyed along a predetermined path, by subjecting the same to an electric current, to electrolytically remove the layers.

30 Claims, 1 Drawing Sheet

PROCESS AND APPARATUS FOR ELECTROLYTICALLY REMOVING PROTECTIVE LAYERS FROM SHEET METAL SUBSTRATE

BACKGROUND OF THE INVENTION

In the art of wet processing, and more particularly, in the electronics industry in which sheets such as printed circuit boards, printed circuit film, foil and the like undergo various processing steps, preparatory to placing electronic components on the sheets. During such processing, the surfaces of the articles are generally etched to provide paths for current flow. Such etching is generally done after a masking operation, during which portions of the sheets are provided with predetermined zones, in which etching is desired to be avoided, leaving the uncoated layers to be etched, then rinsed, dried, etc.

Before or after application of a mask to desired surfaces of the sheets, the sheets are provided to the wet processing system from a source at which they are fabricated, which will generally occur at some time prior thereto, with the sheets often being stored in the interim until needed for use.

In order to protect the sheets, in this interim period after their manufacture, and prior to their being subjected to the wet processing, the boards have generally been coated with protective layers, to protect them during handling or storage of the same, to avoid scratching the surfaces thereof.

Such protective coatings are often oxide coatings, and most often are chromates. One such chromate is zinc chromate ($ZnCrO_4$). Sometimes the coating will additionally, or instead, be of a lacquer or the like substance.

In order to remove such coatings, the sheets may be mechanically worked by means of various grinding, abrading, scrubbing, brushing, honing operations or the like. However, with more sophisticated developments in electronics, the printed circuit sheets tend to be increasingly thinner, such that the removal of protective coatings by mechanical abrasions techniques without damaging the sheet, or without rendering unduly thin the subjacent metal of the sheet, generally copper, becomes extremely difficult.

Accordingly, mechanical removal of protective layers has its limitations.

The chemical removal of protective coatings has also been tried, such as by subjecting the sheet to a spray of acid, such as hot hydrochloric acid. However, such has also been found to have its limitations, and to sometimes be undesirable, because such acids often attack the subjacent generally copper substrate.

Some removal techniques have involved the use of an alkaline solution to remove the oxide coatings, but such also has its limitations because, depending upon which oxides are present, uncertain amounts of the coatings are removed, even though such alkaline solutions generally do not attack the substrate, particularly if the same is copper.

Such prior art techniques have therefore had deficiencies, as respect to removal of protective coatings from printed circuit sheets.

THE PRESENT INVENTION

The present invention is directed to the removal of electrolytically removable protective coatings from printed circuit boards, film, foil or the like (sheets) by electrolytic removal of the same, while the sheets are being continuously fed in a horizontal direction as part of a wet processing operation.

Accordingly, it is an object of the present invention to provide a novel process for the removal of such protective coatings from metal sheets.

It is a further object of this invention to provide the above process, in which the sheets are continuously and serially being delivered along a generally horizontal path.

It is a further object to accomplish the above objects, wherein the sheets are being maintained in a generally flat horizontal plane, as they are being treated.

It is another object of this invention to accomplish the above objects, while the sheets are being moved along their path, and while the sheets are immersed in an electrolyte bath, by maintaining an electric current flow between the sheets functioning as anodes, and a cathode that is disposed in the bath.

It is a further object of this invention to accomplish the above objects while maintaining electrical contact with the sheets in the bath by means of contact rollers.

It is a further object of this invention to remove chromate oxides from printed circuit boards, film, or other sheets, as part of a wet processing operation, while the sheets are being continuously and serially moved in a generally horizontal path, while horizontally oriented, and while the sheets are going through an alkaline bath, preferably comprising a solution of sodium hydroxide.

Further objects of this invention reside in providing suitable apparatus for accomplishing the above objects.

Other objects and advantages of the present invention will be readily apparent to those skilled in the art from a reading of the following brief description of the drawing figure, detailed description of the preferred embodiment, and the appended claims.

BRIEF DESCRIPTION OF THE DRAWING FIGURE

FIG. 1 is a schematic perspective view of a number of processing steps in accordance with invention, in which coating removal, followed by etching, rinsing, drying, and like wet processing operations are performed by means of apparatus of the type schematically illustrated.

DETAILED DESCRIPTION OF THE PREFERRED EMBODIMENT

Figure 1:
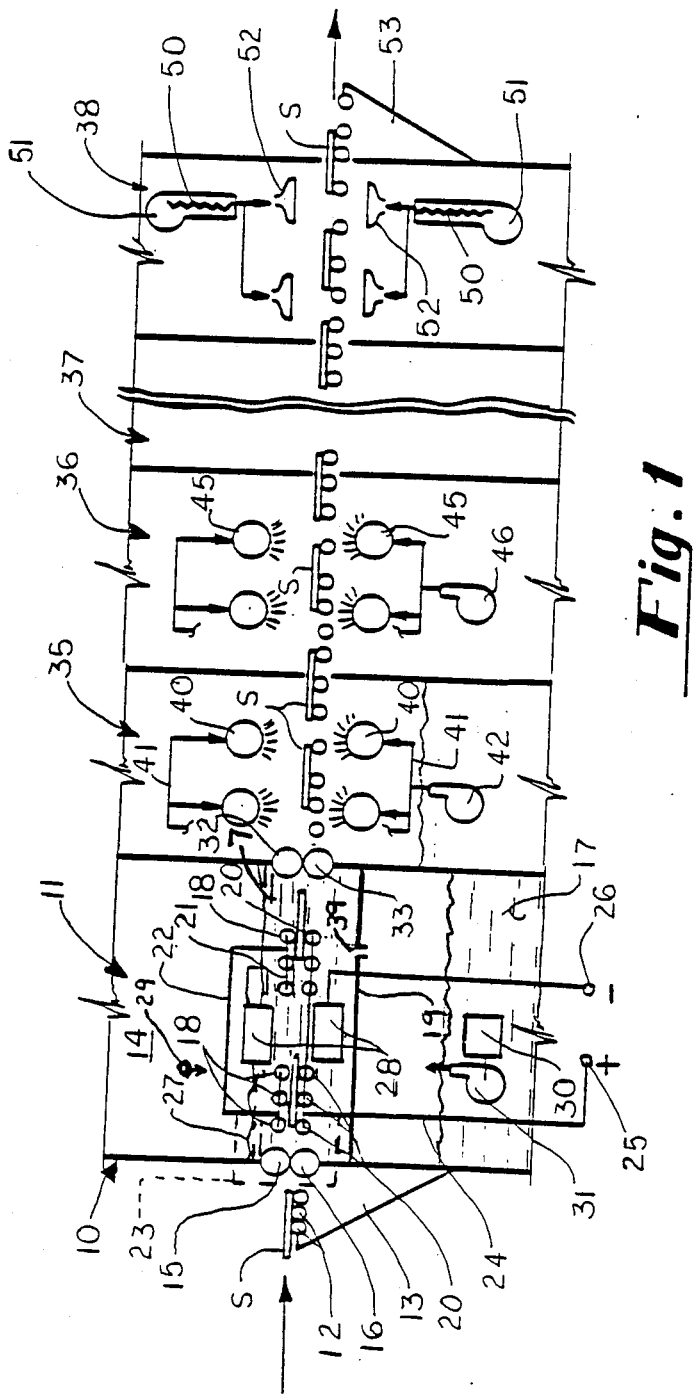

Referring now to the drawing in detail, it will be seen that there are provided sheets S of printed circuit board, foil, film or the like, each comprising at least one metal layer, and most each generally comprising a number of copper foil layers having oxide coatings thereon; (which will generally be chromate coating) and can sometimes be a zinc chromate coating. The sheets S having generally been stored and handled in the usual manner, in a condition in which they are protected against staining, are thus delivered to a wet processing system generally designated by the numeral 10. The wet processing system 10 may comprise a number of separate stations, constructed as part of an integral system, or may comprise a number of modules, with the modules performing various functions, as a particular wet processing system may dictate.

In some instances, prior art pre-removal techniques, such as pumic scrubbing, brushing or vapor honing steps may already have taken place to remove some of the protective layer, particularly if the protective layer has been very thick, and if the sheet S is likewise thick. Most generally, however, such prior art abrading techniques will not be necessary with the present invention, nor will chemical removal techniques be necessary, although the same may be used in conjunction therewith. In instances in which chemical removal techniques are to be used, a number of such prior art removal techniques may employ hydrochloric acid treatment, persulfate peroxide etchants, cupric chloride/ferric chloride etchants, or etchants of various types.

In any event, the sheet S is thus delivered to an electrolytic coating-removal station 11, as illustrated in FIG. 1, wherein it is shown disposed on a plurality of driven rollers 12 that comprise part of an inlet module 13. The sheet S then enters a chamber 14, by passing through a dam formed by upper and lower rollers 15 and 16, respectively, by passing through the nip between the rollers. It will be understood that one or both of the rollers 15, 16 is deformable by suitable cushion or spring-actuated means, to open to permit passage of the sheet S therethrough, whereupon the spring-like action will again close the nip between the rollers, to keep the electrolyte solution 7 shown therein from leaking out.

The electrolyte is preferably an alkaline solution, containing the appropriate chemistry to remove the protective layer. One such solution is sodium hydroxide, and a particular concentration that has been found to be effective is a 10% solution of sodium hydroxide, which does not attack the copper in the sheet S.

The sheet S is then delivered as it moves in generally horizontal orientation along its generally horizontal path, while being continuously driven as it passes through rollers 15 and 16 (which may also be driven, if desirable), until the sheet S passes between upper and lower driven electrode rollers 18 and 20, respectively. A plurality of sets of electrode rollers 18 and 20 may be provided along the path, as shown. Each of the electrode rollers in a set is connected by a suitable conductor 21, which, in turn is electrically connected via conductors 22, 23 (shown in phantom to electrically connect upper and lower sets of rollers ), and 24, which function as anodes, upon the application of a suitable voltage source through the main anode terminal 25, and main cathode terminal 26, as shown.

The means for driving the rollers 18 and 20 may be similar to the drive means shown for rotating wheels from an end thereof, as shown in U.S. Pat. No. 4,015,706, preferably by means of a common drive connected for driving all of the rollers for all of the modules or stations that make up the wet processing system 10 herein. Similarly, the input station 13, output station 53, and intermediate stations may likewise be constructed as shown in the above-mentioned U.S. patent.

It will be seen that the liquid level 27 of the electrolyte 7 is above the level of the electrode rollers 18, and that the cathodes 28 are likewise in the electrolyte, to facilitate current flow from the anodes 18, 20 to the cathodes 28. It will also be apparent that the cathodes 28 may be located at various locations within the bath 7, to facilitate the current flow from the sheet S to the cathodes, and not from the roller anodes 18, 20 directly to the cathodes.

With the process of this invention, when the protective coating is a chromium compound, with the sodium hydroxide bath 7, hydrogen will be released at the cathode and oxygen at the anode, and the chromate compounds will initially attach to the cathodes. The cathodes in this respect may be of steel construction if desired. It will also be noted that a solution is used for the bath 7, such as sodium hydroxide, which does not attack the base material, such as copper, when there is no current flow, or when there is current flow.

With some metal compounds, when precipitates form on the cathodes 28, they become precipitated out of solution, as the chromate compounds are reduced, forming a sludge in the bottom bath 7. This sludge is gradually drawn into a filter 30 located at the bottom of tank 11, by means of a pump 31 which also serves to pump solution from the lower end of tank 11 where it collects back up to the upper tank portion, above upper tank floor 19, to fill upper tank portion via fill line 29. Solution 7 from upper tank portion may drain down into the lower tank portion via drain 39 to provide agitation for the bath 7. In this respect, the system for pumping solution to an upper tank portion is similar to that disclosed in U.S. Pat. No. 4,459,183. Periodically, the filter 30 can be changed, to remove the sludge thus formed. The upper tank portion may be a single upper tank, as shown, or may be a horizontally disposed series of tanks, if desired.

After the sheet S has been treated in the chamber 14 for a sufficient period of time that all of the chromate or other protective coating has been removed during the passage of the sheet through the chamber 14 as it is delivered along its predetermined path, the sheet is then delivered outwardly of the chamber 14 through the nip formed between opposed outlet dam rollers 32 and 33.

It will be noted that the length of the station 11 will be pre-determined, depending upon the amount of time that it will take a given bath solution to remove a given thickness of protective coating from a given substrate, so that the longitudinal length of a station 11 will allow for the continuous passage of the sheet S through the station.

In accordance with this invention, the protective layer is removed without damage to the underlying substrate, even if the sheet S should remain in the solution 7 for a longer period than is necessary, in that no damage can be done to the substrate. There can be no excessive removal; only the totality of coating, whatever that may be.

Also, because of the precipitation of some metal compounds, out of solution, into a sludge to be collected in filter 30, there will also be no excessive build-up of chrome on the cathodes 28.

After passage of the sheet S from station 11, it is continually delivered to subsequent treatment stations, such as etching stations 35, rinsing stations such as 36, various intermediate stations, if desired, such as 37, perhaps to a drying station 38, as desired, all as part of continuous wet processing system while the sheets S are being delivered along their generally horizontal path, while being in horizontal orientation, as shown.

If most instances, an etching station 35 will not immediately follow the coating removal station 11, in that generally a rinsing station 36, followed by a drying station 38 will be utilized. However, if desired, and if the sheet S has otherwise been prepared for etching prior to the application of the protective coating which is being removed in the station 11, the sheet S may perhaps pass directly to an etching station 35. In such an instance, spray headers 40 may deliver a suitable etching via lines 41, fed from pump 42, to suitably spray the sheets as they pass along driven rollers.

As part of the overall system 10, a rinsing station 36 will generally supply water for rinsing the sheets S as they pass through the stations 36, such rinse water being provided via headers 45, fed from a pump 46 as shown.

At a drying station 38, once again while the sheets S are being continuously delivered therethrough, hot air provided from heaters 50 being delivered therethrough, hot air provided dry the sheets S as they pass therethrough, with the sheets S eventually being passed for delivery from the wet processing system, to a discharge conveyer unit 53.

Such stations may, if desired be constructed in accordance with similar stations described in the above-mentioned U.S. Pat. No. 4,015,706, the entire disclosure of which is herein incorporated by reference.

It will be understood herein, that the spray bars 40, 45, will generally extend across the apparatus in a transverse direction, and that the same can if desired, be constructed as flood bars, in accordance with known technology. Similarly, the discharge vents 52 may likewise extend across the apparatus in a transverse direction, and may be constructed in accordance with known technology.

The manner of operation of the rollers 32, 33 that form the discharge nip or dam at the output end of station 11, will be like that described above for the rollers 15, 16.

If will further be understood that the stations 35-38 are merely indicated as representative stations for suitable treatment of sheets S that are used to form printed circuit members. Other treatment steps that may be effected at such stations would include cleaning steps, rinsing steps, etch backing steps, and pre-dipping, activating, and like wet processing steps. In performing such steps, various known components, and constructions from various known patents may be utilized. For example, various spraying, pumping and sump operations from U.S. Pat. No. 3,905.827 may be utilized; various etching and filtering functions may be utilized from U.S. Pat. No. 3,776,800; various etchant removal techniques such as those from U.S. Pat. No. 3,801,387 may be utilized. Also, various drying techniques such as those from U.S. Pat. No. 4,017,982 may be utilized; additionally, the various processing stations of this invention may be embodied in modules that are connected together in the same manner and with a common drive, in accordance with the principles of U.S. Pat. Nos. 4,015,706 and 4,046,248. It will further be understood that in a preferred embodiment, the sheets being treated are not only moving in a generally horizontal path, but are oriented in a generally flat horizontal plane, as well. However, in its broader aspects, the invention can embrace the treating of articles being horizontally conveyed in a vertical orientation, similar to the orientation disclosed in U.S. Pat. No. 4,402,799.

Furthermore, other modifications and variations in the process will be understood to be within the purview of the present invention, as defined in the appended claims.

What is claimed is:

1. A process for the removal of electrolytically removable protective coatings from metal sheets, comprising the steps of:
   (a) providing the sheets with at least some flat exterior surfaces having surface portions with protective coatings;
   (b) continuously and serially delivering the sheets along a predetermined generally horizontal path;
   (c) immersing the sheets in and through an electrolyte bath as the sheets are continuously delivered along their generally horizontal path;
   (d) providing at least one cathode in the bath;
   (e) serially making anodic electrical contact with the sheets as they are delivered along their path through the bath; and
   (f) maintaining an electric current flow between the anodic sheets and the cathode to electrolytically remove the protective coating from the sheets.

2. The process of claim 1, including the step of maintaining the sheets in generally flat horizontal orientation in a generally flat horizontal plane as they are delivered along their generally horizontal path.

3. The process of claim 2, including the step of serially and continuously removing the sheets from the bath as the sheets are maintained in their generally horizontal orientation.

4. The process of claim 2, wherein the step of making anodic electrical contact with the sheets includes engaging the sheets with contact rollers in the bath as the sheets are delivered through the bath.

5. The process of claim 2, wherein the step of immersing the sheets in a bath includes providing opposed pairs of rollers at an inlet and an outlet to the bath, to function as dams for the electrolyte bath, while maintaining the electrolyte bath at a level above the opposed pairs of rollers.

6. The process of claim 2, including the subsequent step of at least rinsing and drying the sheets as they travel along their predetermined path and while they are maintained in generally horizontal orientation.

7. The process of claim 2, including the step of precipitating components of the protective coating out of the bath and collecting them for removal from the bath.

8. The process of claim 2, wherein the step of providing sheets comprises providing sheets each having at least one copper surface with protective coating thereon.

9. The process of any one of claims 1-8, wherein the step of providing sheets with protective coating, comprises providing sheets with oxide coating.

10. The process of any one of claims 1-8, wherein the step of providing sheets with protective coating, comprises providing sheets with chromate coating.

11. The process of any one of claims 1-8, wherein the step of providing sheets with protective coating, comprises providing sheets with zinc chromate coating.

12. The process of any one of claims 1-8, wherein the immersing step comprises passing the sheets through an alkaline bath.

13. The process of any one of claims 1-8, wherein the immersing step comprises passing the sheets through a bath of sodium hydroxide solution.

14. The process of claim 8, wherein the step of providing sheets with protective coating, comprises providing sheets with chromate coating, and wherein the immersing step comprises passing the sheets through an alkaline bath.

15. The process of claim 14, including the step of serially and continuously removing the sheets from the bath as the sheets are maintained in their generally horizontal orientation, wherein the step of immersing the sheets in a bath includes providing opposed pairs of rollers at an inlet and an outlet to the bath, to function as dams for the electrolyte bath, while maintaining the electrolyte bath at a level above the opposed pairs of rollers, wherein the step of making anodic electrical contact with the sheets includes engaging the sheets with contact rollers in the bath as the sheets are delivered through the bath, including the step of precipitating components of the protective coating out of the bath and collecting them for removal from the bath, and including the subsequent steps of at least rinsing and drying the sheets as they travel along their predetermined path and while they are maintained in generally horizontal orientation.

16. Apparatus for the removal of electrolytically removable protective coatings from metal sheets, comprising:

(a) means providing the sheets with at least some flat exterior surfaces having surface portions with protective coatings;

(b) means for continuously and serially delivering the sheets along a predetermined generally horizontal path;

(c) means for immersing the sheets in and through the electrolyte bath as the sheets are continuously delivered along their generally horizontal path;

(d) means providing at least one cathode in the bath;

(e) means for serially making anodic electrical contact with the sheets as they are delivered along their path through the bath; and (f) means for maintaining an electric current flow between the anodic sheets and the cathode to electrolytically remove the protective coating from the sheets.

17. The apparatus of claim 16, including means for maintaining the sheets in generally flat horizontal orientation in a generally flat horizontal plane as they are delivered along their generally horizontal path.

18. The apparatus of claim 17, including means for serially and continuously removing the sheets from the bath as the sheets are maintained in their generally horizontal orientation.

19. The apparatus of claim 17, wherein the means for making anodic electrical contact with the sheets includes engaging the sheets with contact rollers in the bath as the sheets are delivered through the bath.

20. The apparatus of claim 17, wherein the means for immersing the sheets in a bath includes opposed pairs of rollers means at an inlet and an outlet to the bath, for functioning as dams for the electrolyte bath, and means for maintaining the electrolyte bath at a level above the opposed pairs of rollers.

21. The apparatus of claim 17, including means for subsequently at least rinsing and drying the sheets as they travel along their predetermined path and while they are maintained in generally horizontal orientation.

22. The apparatus of claim 17, including means for collecting components of the protective coating that are precipitated out of the bath.

23. The apparatus of claim 17, wherein the means providing sheets comprises means providing sheets each having at least one copper surface with protective coating thereon.

24. The apparatus of any one of claims 16–23, wherein the means providing sheets with protective coating, comprises means providing sheets with oxide coating.

25. The apparatus of any one of claims 16–23, wherein the means providing sheets with protective coating, comprises means providing sheets with chromate coating.

26. The apparatus of any one of claims 16–23, wherein the means providing sheets with protective coating, comprises means providing sheets with zinc chromate coating.

27. The apparatus of any one of claims 16–23, wherein the means for immersing comprises means for passing the sheets through an alkaline bath.

28. The apparatus of any one of claims 16–23, wherein the means for immersing comprises means for passing the sheets through a bath of sodium hydroxide solution.

29. The apparatus of claim 23, wherein the means providing sheets with protective coating, comprises means providing sheets with chromate coating, and wherein the means for immersing comprises means for passing the sheets through an alkaline bath.

30. The apparatus of claim 29, including means for serially and continuously removing the sheets from the bath as the sheets are maintained in their generally horizontal orientation, wherein the means for immersing the sheets in a bath includes opposed pairs of roller means at an inlet and an outlet to the bath, for functioning as dams for the electrolyte bath, and means for maintaining the electrolyte bath at a level above the opposed pairs of rollers, wherein the means for making anodic electrical contact with the sheets includes means engaging the sheets with contact rollers in the bath as the sheets are delivered through the bath, including means for collecting components of the protective coating that are precipitating out of the bath, and including means for subsequently at least rinsing and drying the sheets as they travel along their predetermined path and while they are maintained in generally horizontal orientation.

* * * * *

UNITED STATES PATENT OFFICE
CERTIFICATE OF CORRECTION

Patent No. 4,859,298          Dated August 22, 1989

Inventor(s) F. Gerhard Senge, Angus A. Watson, Kenneth E. Sanner, Terry R. Corbin It is certified that error appears in the above-identified patent and that said Letters Patent is hereby corrected as shown below:

In Column 5, line 5, after "heaters 50 being delivered" delete -- therethrough hot air provided -- and insert therefore -- from air pumps 51 will be provided from upper and lower discharge vents 52, to suitably --;

In Column 5, line 32 after "rinsing steps" insert -- drying steps, desmearing steps, inspecting steps, rinsing steps, --.

Signed and Sealed this

Seventeenth Day of April, 1990

Attest:

HARRY F. MANBECK, JR.

*Attesting Officer*          *Commissioner of Patents and Trademarks*